US012660283B2

(12) United States Patent
Tsai et al.

(10) Patent No.: US 12,660,283 B2
(45) Date of Patent: Jun. 16, 2026

(54) SEMICONDUCTOR DEVICE AND METHOD OF FABRICATING THE SAME

(71) Applicant: United Microelectronics Corp., Hsinchu (TW)

(72) Inventors: Ming-Hua Tsai, Tainan City (TW); Wei Hsuan Chang, Tainan City (TW); Chin-Chia Kuo, Tainan City (TW)

(73) Assignee: United Microelectronics Corp., Hsinchu (TW)

( * ) Notice: Subject to any disclaimer, the term of this patent is extended or adjusted under 35 U.S.C. 154(b) by 364 days.

(21) Appl. No.: 18/460,605

(22) Filed: Sep. 4, 2023

(65) Prior Publication Data

US 2025/0056868 A1     Feb. 13, 2025

(30) Foreign Application Priority Data

Aug. 7, 2023     (CN) .......................... 202310985583.7

(51) Int. Cl.
| | |
|---|---|
| *H10D 64/27* | (2025.01) |
| *H10D 30/01* | (2025.01) |
| *H10D 30/60* | (2025.01) |
| *H10D 62/00* | (2025.01) |
| *H10D 64/01* | (2025.01) |

(52) U.S. Cl.
CPC ....... *H10D 64/516* (2025.01); *H10D 30/0212* (2025.01); *H10D 30/027* (2025.01); *H10D 30/603* (2025.01); *H10D 30/605* (2025.01); *H10D 30/608* (2025.01); *H10D 62/021* (2025.01); *H10D 64/01* (2025.01)

(58) Field of Classification Search
CPC ............. H10D 64/516; H10D 30/0212; H10D 30/027; H10D 30/603; H10D 30/605; H10D 30/608; H10D 62/021; H10D 64/01
See application file for complete search history.

(56) References Cited

U.S. PATENT DOCUMENTS

| | | |
|---|---|---|
| 6,087,237 A | 7/2000 | Hwang |
| 2022/0085210 A1 | 3/2022 | Hsiung et al. |

*Primary Examiner* — Samuel A Gebremariam
(74) *Attorney, Agent, or Firm* — JCIPRNET

(57) ABSTRACT

A method of fabricating a semiconductor device is provided. Recesses are formed in a substrate. A first gate dielectric material is formed on the substrate and filled in the recesses. The first gate dielectric material on the substrate between the recesses is at least partially removed to form a trench. A second gate dielectric material is formed in the trench. A gate conductive layer is formed on the second gate dielectric material. Spacers are formed on sidewalls of the gate conductive layer. A portion of the first gate dielectric material is removed. The remaining first gate dielectric material and the second gate dielectric layer form a gate dielectric layer. The gate dielectric layer includes a body part and a first hump part at a first edge of the body part. The first hump part is thicker than the body part. Doped regions are formed in the substrate beside the spacers.

14 Claims, 22 Drawing Sheets

SEMICONDUCTOR DEVICE AND METHOD OF FABRICATING THE SAME

CROSS-REFERENCE TO RELATED APPLICATION

This application claims the priority benefit of China application serial no. 202310985583.7, filed on Aug. 7, 2023. The entirety of the above-mentioned patent application is hereby incorporated by reference herein and made a part of the specification.

BACKGROUND

Technical Field

The present disclosure is related to an integrated circuit and a method of fabricating the same, and particularly to a semiconductor device and a method of fabricating the same.

Description of Related Art

Transistors are very important devices in integrated circuits. The ability (e.g., saturation current) of the drive current and the gate-induced drain leakage (GIDL) current are important factors affecting the transistor performance. The ability of the drive current can be improved by reducing the thickness of a gate dielectric layer. However, when the thickness of the gate dielectric layer is too small, the gate-induced drain leakage current easily occurs at the overlapping region between the gate and the drain region.

SUMMARY

The present disclosure provides a semiconductor device and a method of fabricating the same. The semiconductor device has a lower threshold voltage, a lower gate-induced drain leakage current, and a higher source/drain voltage.

In an embodiment of the present disclosure, a method of fabricating a semiconductor device includes the following steps. A plurality of recesses are formed in a substrate. A first gate dielectric material is formed on the substrate and in the plurality of recesses. The first gate dielectric material on the substrate between the plurality of recesses is at least partially removed, so as to form a trench. A second gate dielectric material is formed in the trench. A gate conductive layer is formed on the second gate dielectric material, and a plurality of spacers are formed on sidewalls of the gate conductive layer. A portion of the first gate dielectric material is removed, so that the remaining first gate dielectric material and the second gate dielectric material form a gate dielectric layer. The gate dielectric layer includes a body part, and a first hump part located at a first edge of the body part. A thickness of the first hump part is greater than a thickness of the body part. A plurality of doped regions are formed in the substrate at two sides of the plurality of spacers.

In an embodiment of the present disclosure, a method of fabricating a semiconductor device includes the following steps. A first gate dielectric material is formed on a substrate. The first gate dielectric material is patterned to form a trench. A second gate dielectric material is formed in the trench. A gate conductive layer is formed on the second gate dielectric material and the first gate dielectric material, and a plurality of spacers are formed on sidewalls of the gate conductive layer. Portions of the second gate dielectric material and the first gate dielectric material are removed to form a gate dielectric layer. The gate dielectric layer includes a body part, and a first hump part located at a first edge of the body part, wherein a thickness of the first hump is greater than a thickness of the body part. A plurality of doped regions are formed in the substrate at two sides of the plurality of spacers.

In an embodiment of the present disclosure, a semiconductor device includes a gate structure and a plurality of doped regions. The gate structure includes a gate conductive layer and a gate dielectric layer. The gate conductive layer is located over the substrate. The gate dielectric layer is located between the gate conductive layer and the substrate. The gate dielectric layer includes a body part and a first hump part. The body part is located on the flat surface of the substrate. The first hump part is located on a portion of the flat surface at a first edge of the body part. The thickness of the first hump is greater than the thickness of the body part. The plurality of doped regions are located in the substrate at two sides of the gate structure.

Based on the above, the gate dielectric layer of a semiconductor device of an embodiment of the present disclosure has different thicknesses. The thickness of a body part in the central region of the gate dielectric layer is smaller, so as to reduce the threshold voltage. The thickness of a hump part in the edge region of the gate dielectric layer is greater, so as to reduce the gate-induced drain leakage and allow higher source/drain voltages.

DESCRIPTION OF THE EMBODIMENTS

FIG. 1A to FIG. 1J are schematic cross-sectional views of a method of fabricating a semiconductor device according to an embodiment of the present disclosure.

Figure 1A:
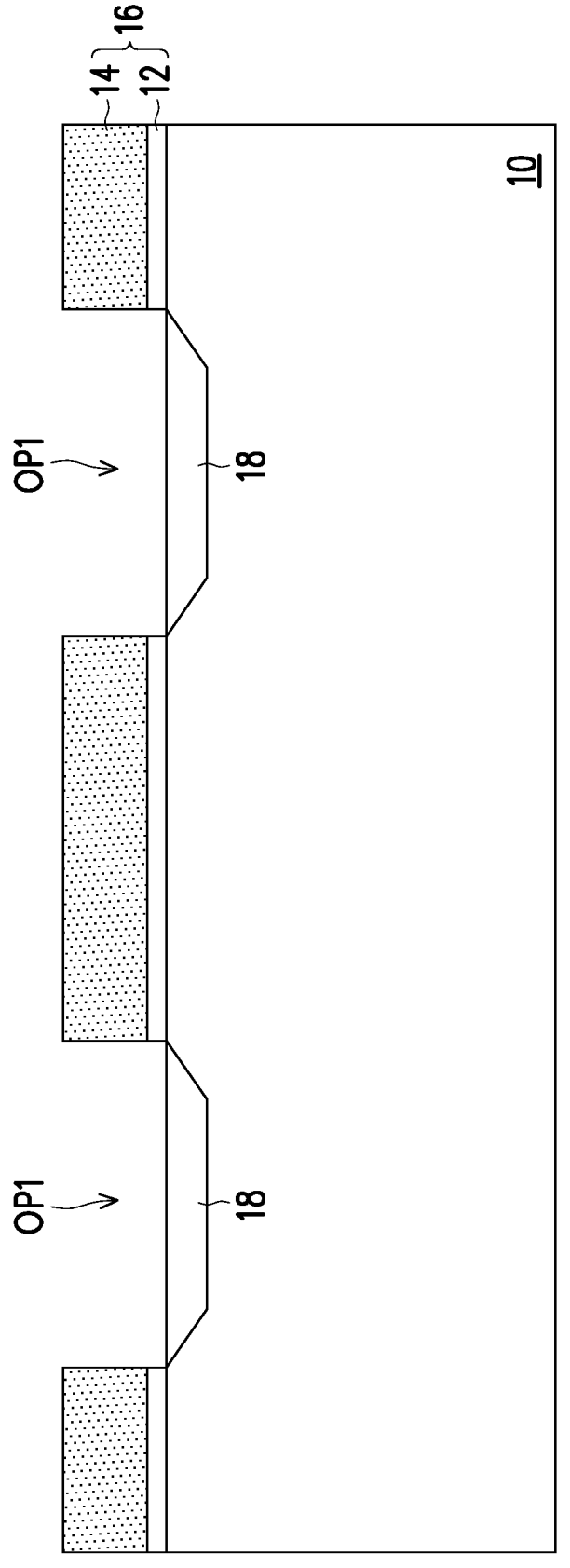
FIG. 1A to FIG. 1J are schematic cross-sectional views of a method of fabricating a semiconductor device according to an embodiment of the present disclosure.

Referring to FIG. 1A, a substrate 10 is provided. The substrate 10 includes a semiconductor substrate and a semiconductor compound substrate, such as a silicon substrate and a silicon germanium substrate. The substrate 10 may be a silicon-on-insulator (SOI) substrate. A mask layer 16 is formed on the substrate 10. The mask layer 16 may include a silicon oxide layer 12 and a silicon nitride layer 14. The mask layer 16 has multiple openings OP1 that expose the surfaces of the substrate 10. Afterwards, a thermal oxidation process is performed to form oxide layers 18 on the exposed surfaces of the substrate 10 in the openings OP1.

Figure 1B:
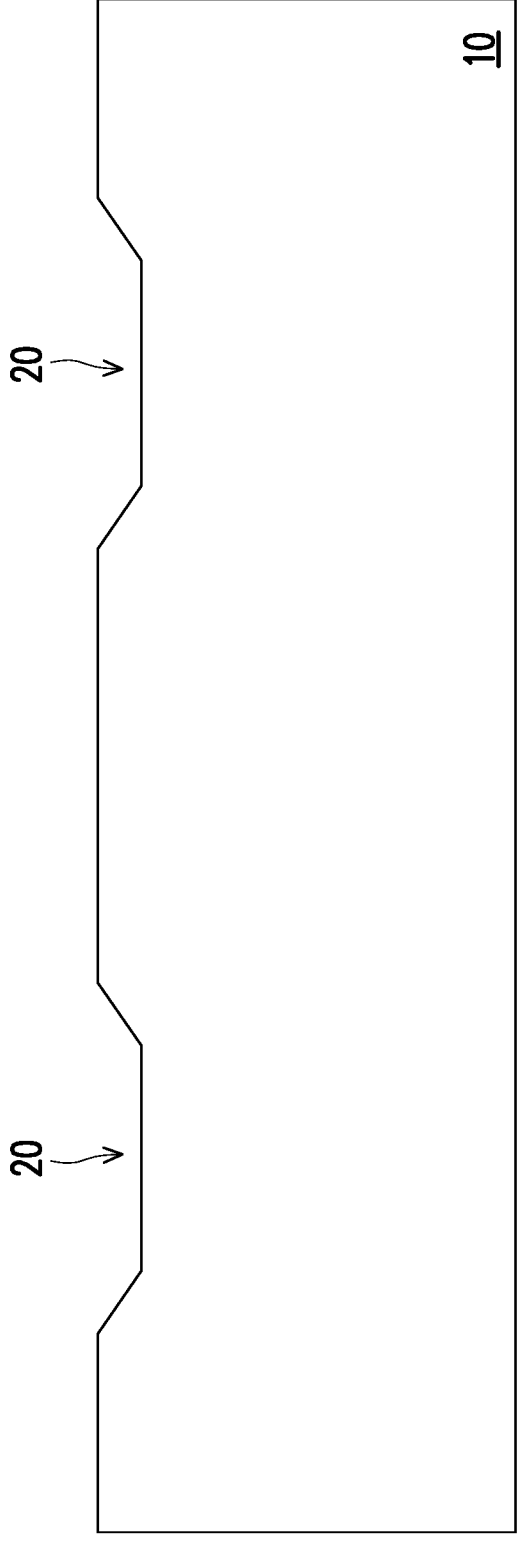

Referring to FIG. 1B, an etching process (e.g., a wet etching process) is performed to remove the mask layer 16 and the thermal oxide layers 18, so as to expose the surface of the substrate 10 and form multiple recesses 20 in the substrate 10. The recesses 20 may be formed with various methods, not limited to the above method.

Figure 1C:
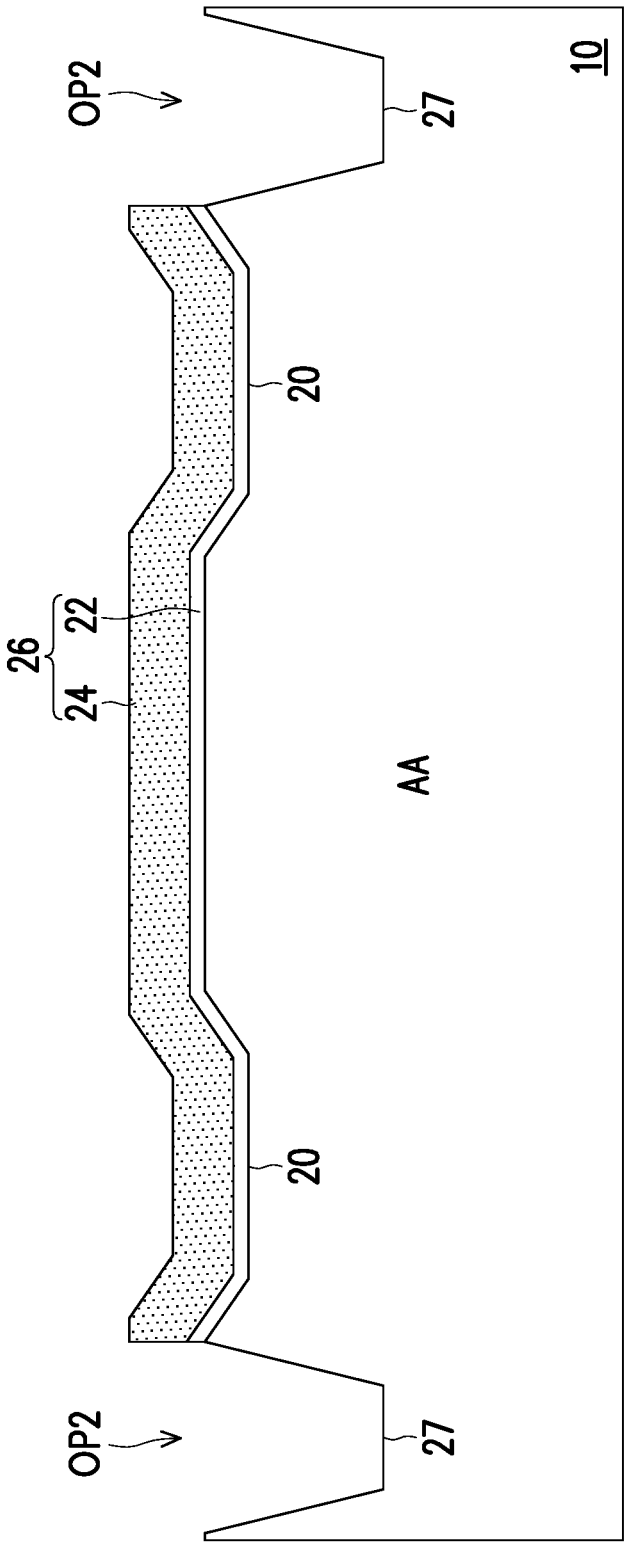

Referring to FIG. 1C, a mask layer 26 is formed on the substrate 10. The mask layer 26 may include a silicon oxide layer 22 and a silicon nitride layer 24. The mask layer 26 is patterned through lithography and etching processes to have multiple openings OP2 that expose the surfaces of the substrate 10. Next, an etching process (e.g., an anisotropic etching process) is performed to remove portions of the substrate 10 to form multiple trenches 27 in the substrate 10. The depth of trenches 27 is greater than the depth of recesses 20.

Figure 1D:
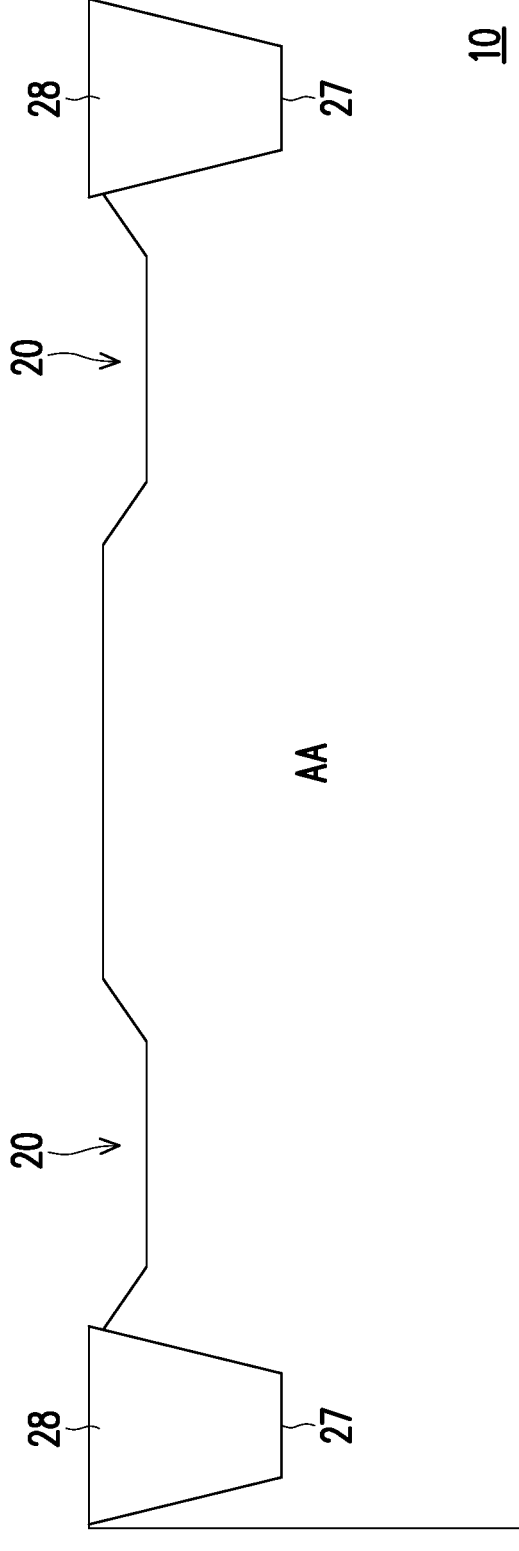

Referring to FIG. 1D, multiple isolation structures 28 are formed in the trenches 27. The isolation structures 28 can have a single-layer or multi-layer structure. The material of the isolation structures 28 includes silicon oxide, silicon nitride or a combination thereof. The method of forming the isolation structures 28 includes forming an isolation material on the substrate 10 and in the recesses 20 and the trenches 27, and then performing an etching back or a chemical mechanical polishing to remove the excess isolation material in the substrate 10 and the recesses 20. The isolation structures 28 define an active region AA in the substrate 10. After that, the mask layer 26 is removed to expose the recesses 20.

Figure 1E:
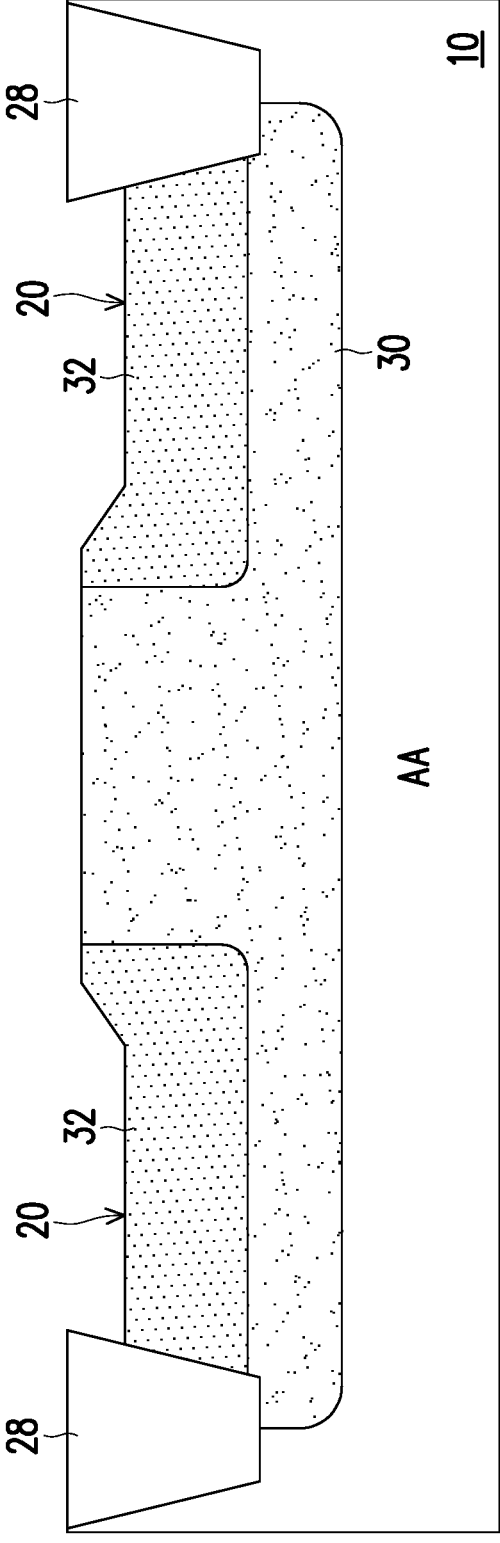

Referring to FIG. 1E, a well region 30 is formed in the substrate 10, and multiple doped regions 32 are formed in the well region 30. The multiple doped regions 32 are located in the well region 30 and separated from each other, and the sidewall and bottom of each doped region 32 are covered by the well region 30. The well region 30 and the multiple doped regions 32 may be formed by forming respective mask layers (not shown) on the substrate 10, and then performing respective ion implantation processes. In some embodiments, the well region 30 has a dopant of a first conductivity type, and the doped regions 32 have a dopant of a second conductivity type.

The dopant of the first conductivity type may be a P-type dopant, such as boron or boron trifluoride. The dopant of the second conductivity type may be an N-type dopant, such as phosphorus or arsenic.

Figure 1F:
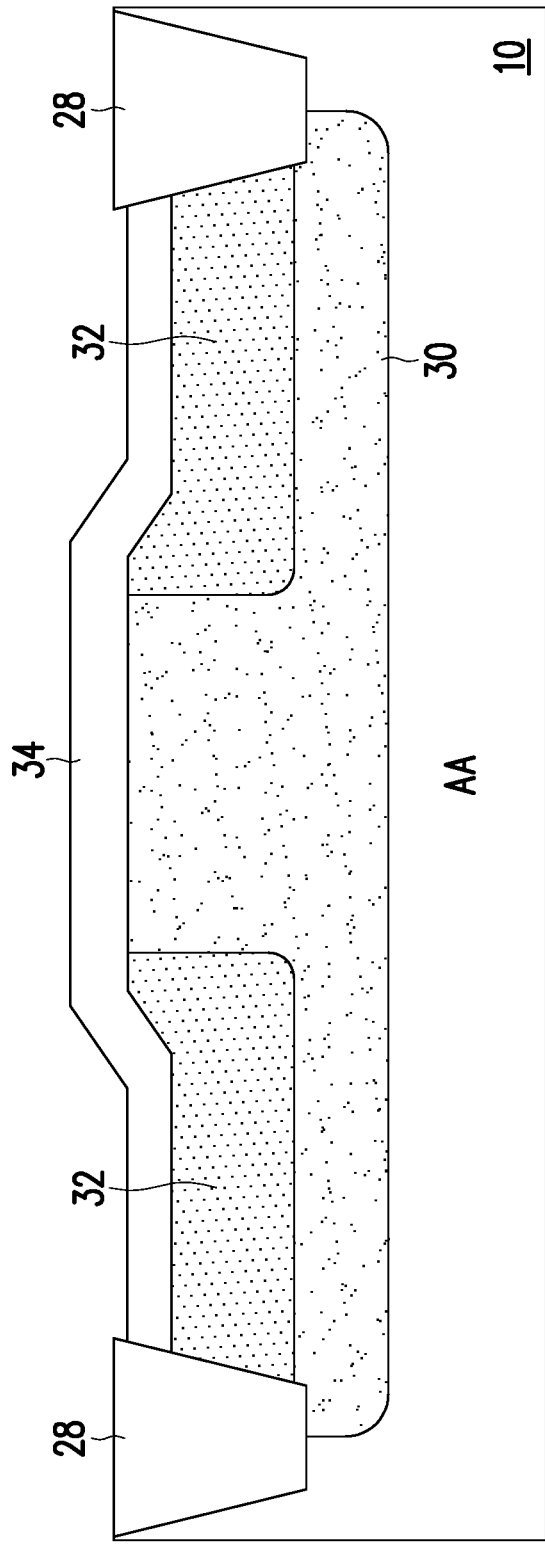

Referring to FIG. 1F, a first gate dielectric material 34 is formed on the substrate 10 and in the multiple recesses 20. The first gate dielectric material 34 includes silicon oxide. The method of forming the first gate dielectric material 34 includes a thermal oxidation method.

Figure 1G:
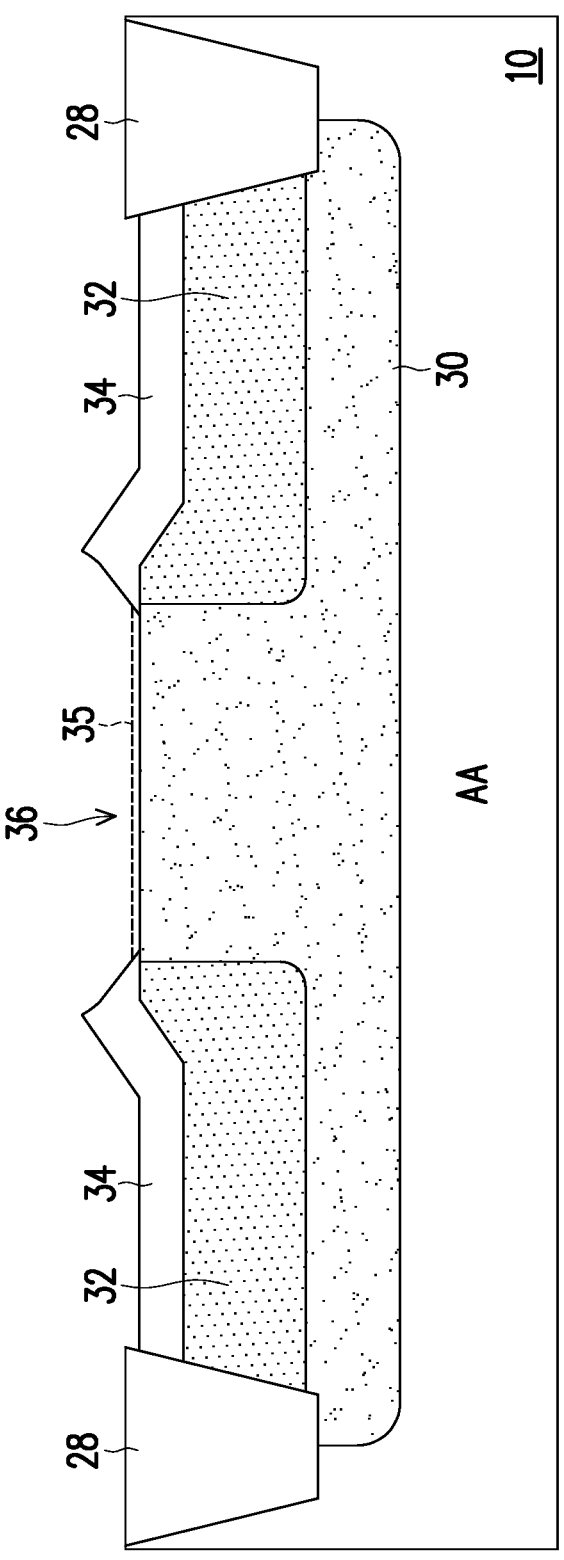

Referring to FIG. 1G, a mask layer (not shown) is formed on the first gate dielectric material 34, and then an etching process (e.g., an anisotropic etching process) is performed to at least partially remove the first gate dielectric material 34 on the substrate 10 between the recesses 20, so as to form a trench 36. In some embodiments, the bottom of the trench 36 exposes the surface of the substrate 10. In other embodiments, a portion of the first gate dielectric material 34 remains at the bottom of the trench 36, as shown by the dashed line 35.

Figure 1H:
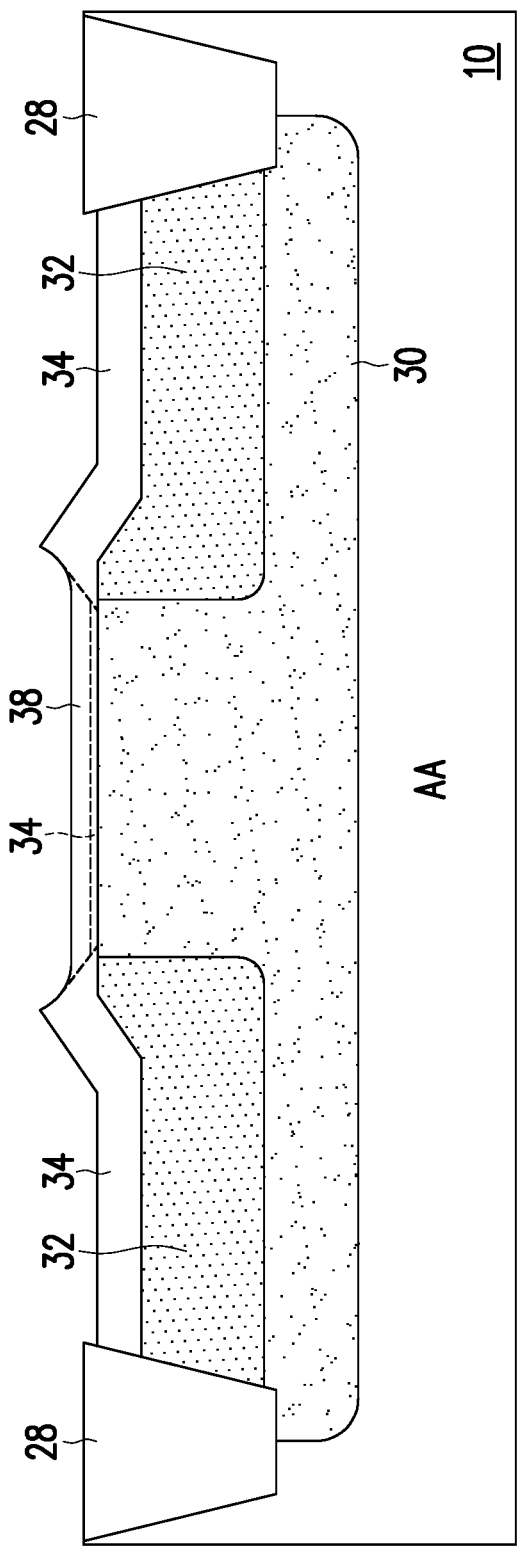

Referring to FIG. 1H, a second gate dielectric material 38 is formed in the trench 36. The second gate dielectric material 38 may be silicon oxide, and the forming method may include a thermal oxidation method. In other embodiments, the second gate dielectric material 38 may be a high dielectric constant material. In other embodiments, no matter whether a portion of the first gate dielectric material 34 remains on the bottom of the trench 36 or not, the gate dielectric material remains in the trench 36 is collectively referred to as the second gate dielectric material 38.

Figure 1I:
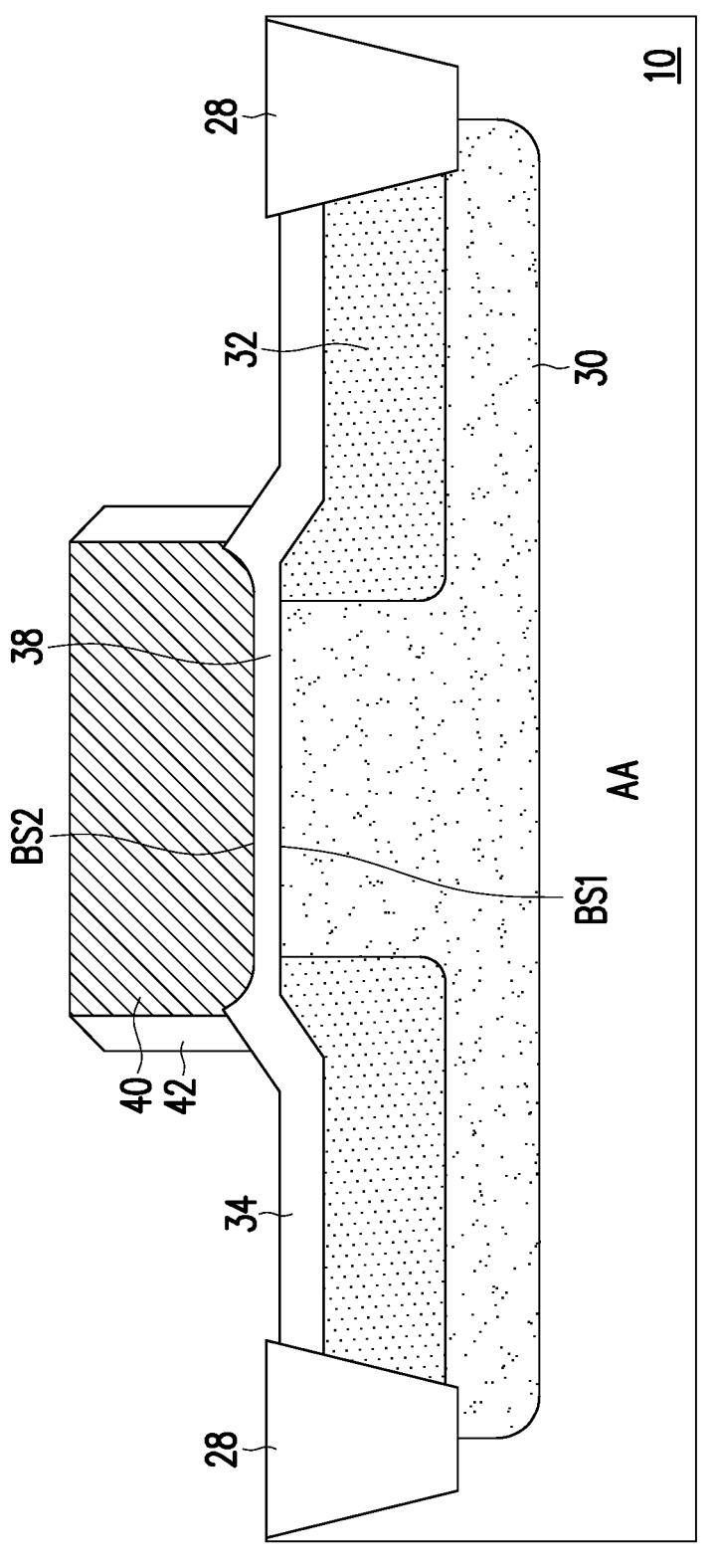

Referring to FIG. 1I, a gate conductive layer 40 is formed on the second gate dielectric material 38 and the first gate dielectric material 34, and multiple spacers 42 are formed on the sidewalls of the gate conductive layer 40. The gate conductive layer 40 may be a semiconductor gate or a metal gate. The semiconductor gate includes a doped semiconductor material. The metal gate includes metal (e.g., non-composite metal), conductive metal nitride, conductive metal carbonitride, conductive metal carbide, conductive metal oxynitride, conductive metal oxide, metal silicide, or a combination thereof. The metal gate may include, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof.

The gate conductive layer 40 may be formed by lithography and etching processes, or may be formed by a gate replacement method. The gate replacement method may include forming a dummy gate conductive layer (e.g., a polysilicon layer) on the second gate dielectric material 38 and the first gate dielectric material 34, and then forming spacers 42 on the sidewalls of the dummy gate conductive layer. An interlayer dielectric layer is formed on the substrate 10, and the dummy gate conductive layer is then removed to form a gate trench in the interlayer dielectric layer. Thereafter, a metal material is filled back in the gate trench to form the metal gate. The spacers 42 can have a single-layer or multi-layer structure. The material of the spacers 42 includes silicon oxide, silicon nitride or a combination thereof.

Figure 1J:
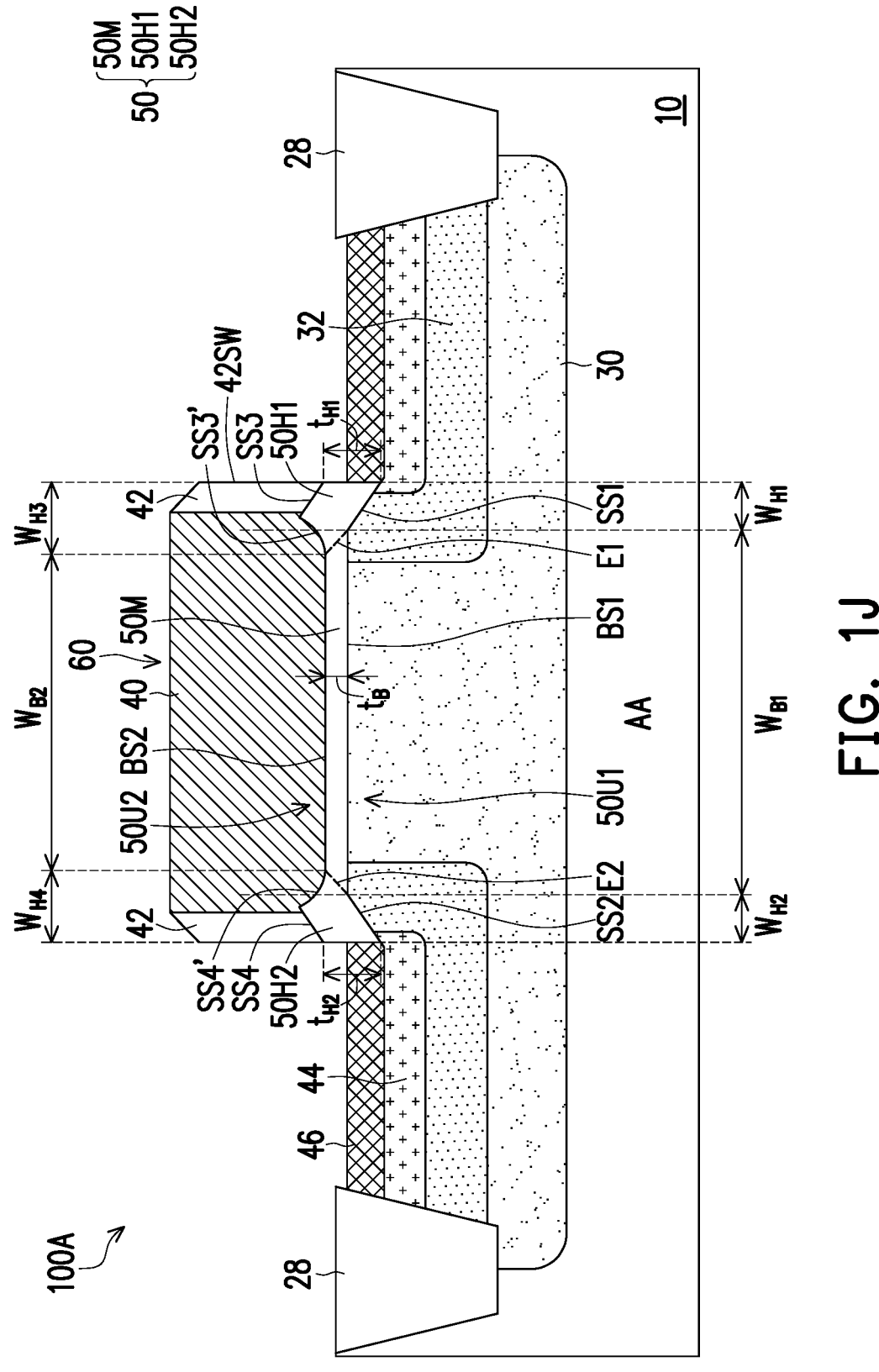

Referring to FIG. 1J, an etching process is performed by using the spacers 42 as a mask, so as to remove a portion of the first gate dielectric material 34. The remaining first gate dielectric material 34 and second gate dielectric material 38 form a gate dielectric layer 50. The gate dielectric layer 50 and the gate conductive layer 40 are collectively referred to as a gate structure 60.

Referring to FIG. 1J, multiple doped regions 44 are respectively formed in the doped region 32 of the substrate 10. Each doped region 44 is located in the corresponding doped region 32, and the sidewall and bottom of each doped region 44 are covered by the corresponding doped region 32. The method of forming the multiple doped regions 44 may include forming a mask layer (not shown) on the substrate 10, and then performing an ion implantation process. In some embodiments, the multiple doped regions 44 and the multiple doped regions 32 have a dopant of the second conductivity type. The dopant of the second conductivity type may be an N-type dopant, such as phosphorus or arsenic. The doped concentration of the multiple doped regions 44 is greater than the doped concentration of the multiple doped regions 32. Therefore, the doped regions 44 are called heavily-doped regions, and doped regions 32 are called lightly-doped regions. The multiple doped regions 44 can serve as source/drain regions.

Next, a metal silicide process is performed to form metal silicide layers 46 on the doped region 44, respectively. In other embodiments, a metal silicide layer (not shown) is further formed on the gate conductive layer 40. The metal silicide layers 46 include titanium silicide, cobalt silicide, nickel silicide, molybdenum silicide, ruthenium silicide or tungsten silicide. The semiconductor device 100A is thus formed.

In this embodiment, the gate dielectric layer 50 is located between the gate conductive layer 40 and the substrate 10, and between the spacers 42 and the substrate 10. The sidewalls of the gate dielectric layer 50 are substantially flushed with the outer sidewalls 42SW of the spacers 42. The thickness at the center of the gate dielectric layer 50 is thinner, while the thickness at the edge of the gate dielectric layer 50 is thicker. The gate dielectric layer 50 may include a body part 50M, a first hump part 50H1 and a second hump part 50H2.

The body part 50M is substantially located at the center of the active region AA. The bottom surface BS1 and the top surface BS2 of the body part 50M have substantially flat surfaces. The bottom surface BS1 of the body part 50M is in contact with the well region 30 and the doped regions 32. The top surface BS2 of the body part 50M is in contact with the gate conductive layer 40. The cross section of the body part 50M is substantially trapezoidal. The width WB1 of the bottom surface BS1 is greater than the width WB2 of the top surface BS2 of the body part 50M.

The first hump part 50H1 is located at the first edge E1 of the body part 50M. The second hump part 50H2 is located at the second edge E2 of the body part 50M. The first hump part 50H1 and the second hump part 50H2 may be symmetrical or asymmetrical. The first hump part 50H1 and the second hump part 50H2 may have similar shapes. The bottom surface SS1 of the first hump part 50H1 is an inclined surface, which is in contact with one doped region 32 and one doped region 44. The bottom surface SS2 of the second hump part 50H2 is an inclined surface, which is in contact with another doped region 32 and another doped region 44.

The top surface SS3 of the first hump part 50H1 is in contact with the spacer 42. The top surface SS3' of the first hump part 50H1 is in contact with the gate conductive layer 40. The top surface SS3 and the top surface SS3' form an inverted V shape. The top surface (including the top surface SS3 and the top surface SS3') of the first hump part 50H1 is mountain-shaped. The top surface SS3 and the bottom surface SS1 are inclined in the same direction, and the top surface SS3' and the bottom surface SS1 are inclined in different directions. The top surface SS3 and the bottom surface SS1 have a negative slope, and the top surface SS3' has a positive slope. The top surface SS3 may be approximately parallel to the bottom surface SS1. The sidewall of the first hump part 50H1 is substantially flushed with the outer sidewall 42SW of the spacer 42. The sidewall of the first hump part 50H1 is in contact with the metal silicide layer 46.

Similarly, the top surface SS4 of the second hump part 50H2 is in contact with the spacer 42. The top surface SS4' of the second hump part 50H2 is in contact with the gate conductive layer 40. The top surface SS4 and the top surface SS4' form an inverted V shape. The top surface (including the top surface SS4 and the top surface SS4') of the second hump part 50H2 is mountain-shaped. The top surface SS4 and the bottom surface SS2 are inclined in the same direction, and the top surface SS4' and the bottom surface SS2 are inclined in different directions. The top surface SS4 and the bottom surface SS2 have a positive slope, and the top surface SS4' has a negative slope. The top surface SS4 may be approximately parallel to the bottom surface SS2. The sidewall of the second hump part 50H2 is substantially flushed with the outer sidewall 42SW of the spacer 42. The sidewall of the second hump part 50H2 is in contact with the metal silicide layer 46.

The bottom surface BS1 of the body part 50M, the bottom surface SS1 of the first hump part 50H1, and the bottom surface SS2 of the second hump part 50H2 form a bottom surface 50U1. The bottom surface 50U1 is an inverted U-shaped surface. The top surface BS2 of the body part 50M, the top surface SS3' of the first hump part 50H1, and the top surface SS4' of the second hump part 50H2 form a top surface 50U2. The top surface 50U2 is a U-shaped surface. In some embodiments, the U-shaped surface is asymmetrical to the inverted U-shaped surface.

The width $W_{B1}$ of the bottom surface BS1 of the body part 50M may be greater than or equal to the width $W_{H1}$ of the bottom surface SS1 of the first hump part 50H1, and greater than or equal to the width $W_{H2}$ of the bottom surface SS2 of the second hump part 50H2. Similarly, the width $W_{B2}$ of the top surface BS2 of the body part 50M is greater than or equal to the width $W_{H3}$ of the top surface of the first hump part 50H1, and greater than or equal to the width $W_{H4}$ of the top surface of the second hump part 50H2. In short, the width of the body part 50M is greater than or equal to the width of the first hump part 50H1, and greater than or equal to the width of the second hump part 50H2.

The thickness $t_{H1}$ of the first hump part 50H1 is greater than the thickness $t_B$ of the body part 50M. The thickness $t_{H2}$ of the second hump part 50H2 is greater than the thickness $t_B$ of the body part 50M. The thickness $t_{H2}$ of the second hump part 50H2 may be substantially equal to the thickness $t_{H1}$ of the first hump part 50H1. The thickness $t_B$, the thickness $t_{H1}$, and the thickness $t_{H2}$ refer to average thicknesses, respectively. In the embodiment where the semiconductor device 100A is a low-voltage device, the thickness $t_B$ of the body part 50M is from about 1 angstrom to 50 angstroms, and each of the thickness $t_{H1}$ of the first hump part 50H1 and the thickness $t_{H1}$ of the second hump part 50H2 is from about 100 angstroms to 300 angstroms. In the embodiment where the semiconductor device 100A is a medium-voltage device, the thickness $t_B$ of the body part 50M is from about 50 angstroms to 250 angstroms, and each of the thickness $t_{H1}$ of the first hump part 50H1 and the thickness $t_{H1}$ of the second hump part 50H2 is from about 100 angstroms to 300 angstroms. The thickness $t_B$ of the body part 50M is smaller, so as to reduce the threshold voltage. The thickness $t_{H1}$ of the first hump part 50H1 and the thickness $t_{H2}$ of the second hump part 50H2 is bigger, so as to increase the voltages applied to the source/drain regions and reduce the gate-induced drain leakage current.

Figure 2A:
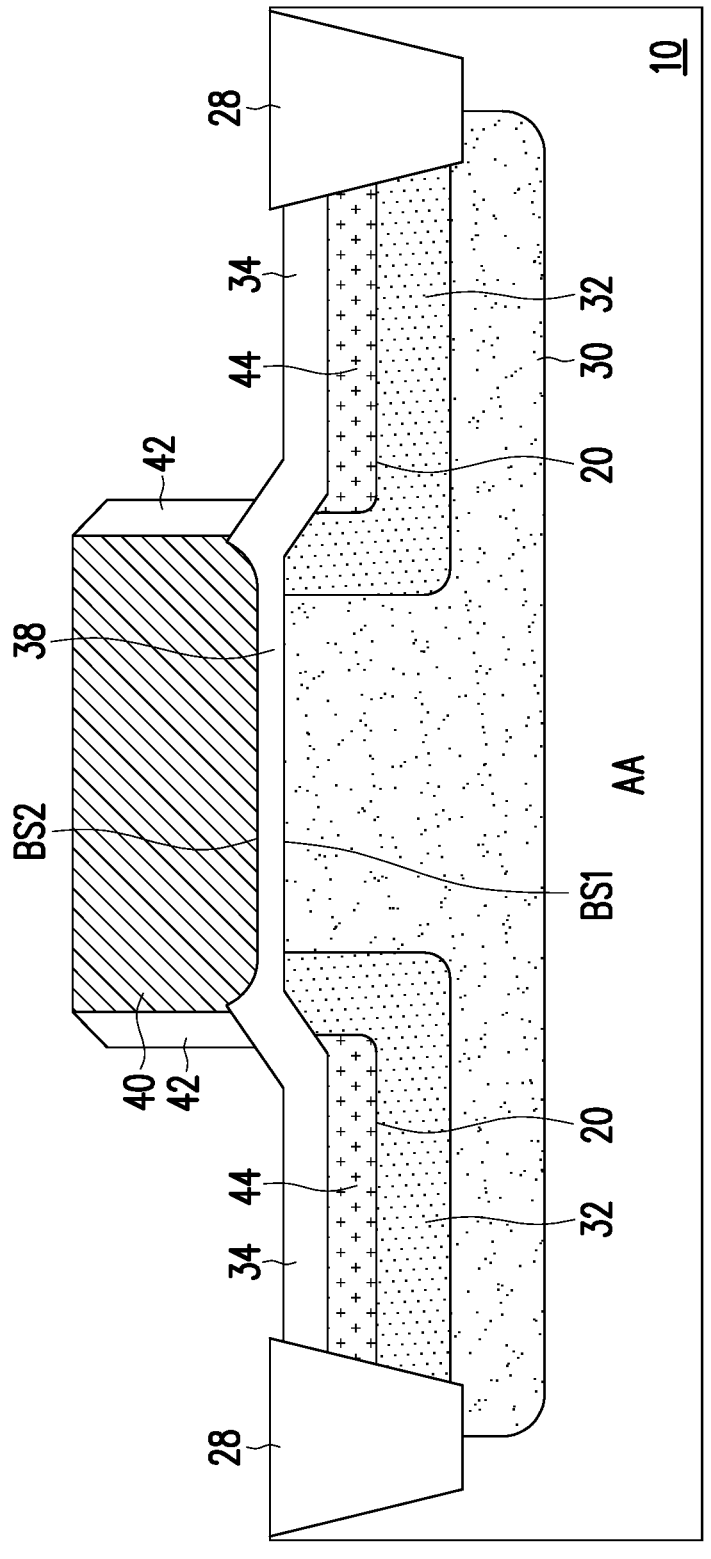
FIG. 2A to FIG. 2C are schematic cross-sectional views of a method of fabricating a semiconductor device according to another embodiment of the present disclosure.
Figure 2B:
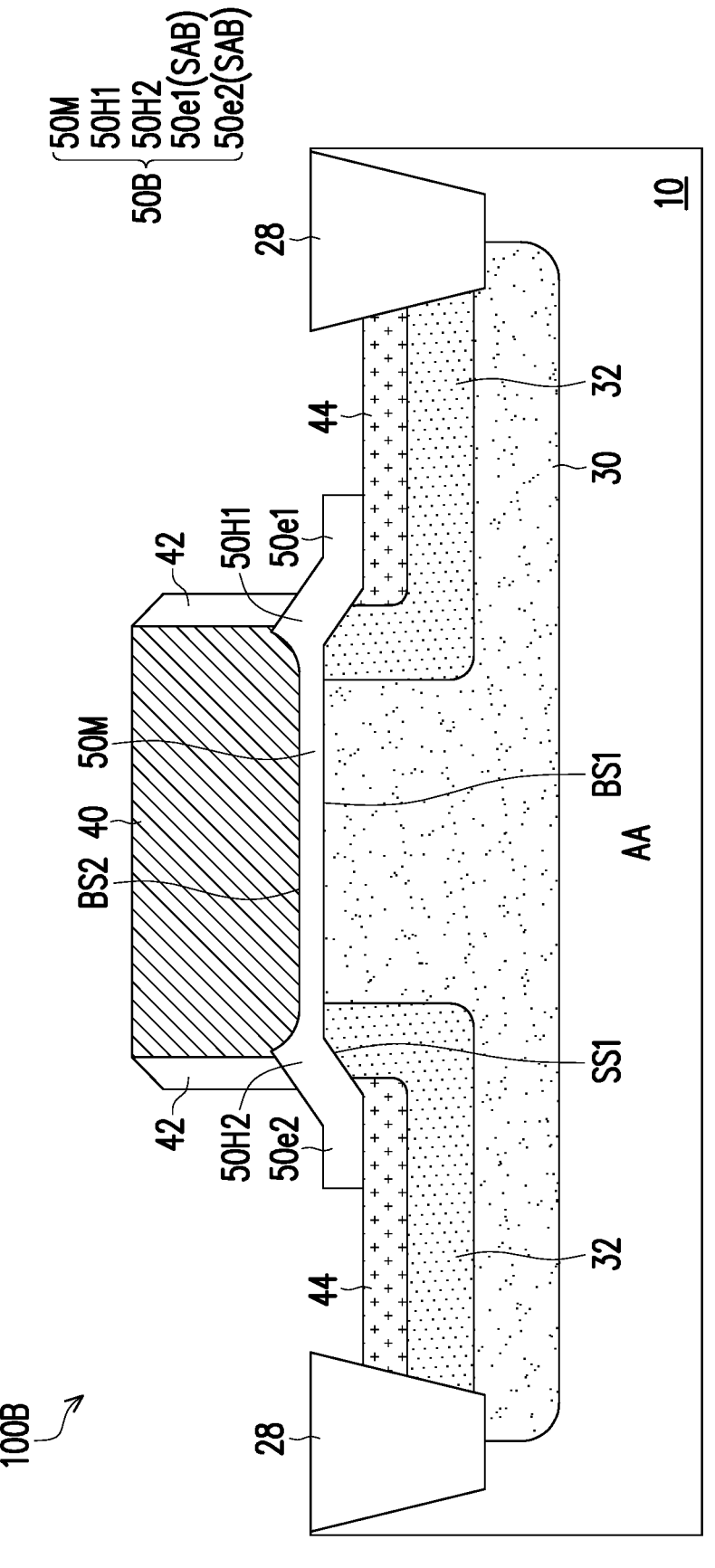
Figure 2C:
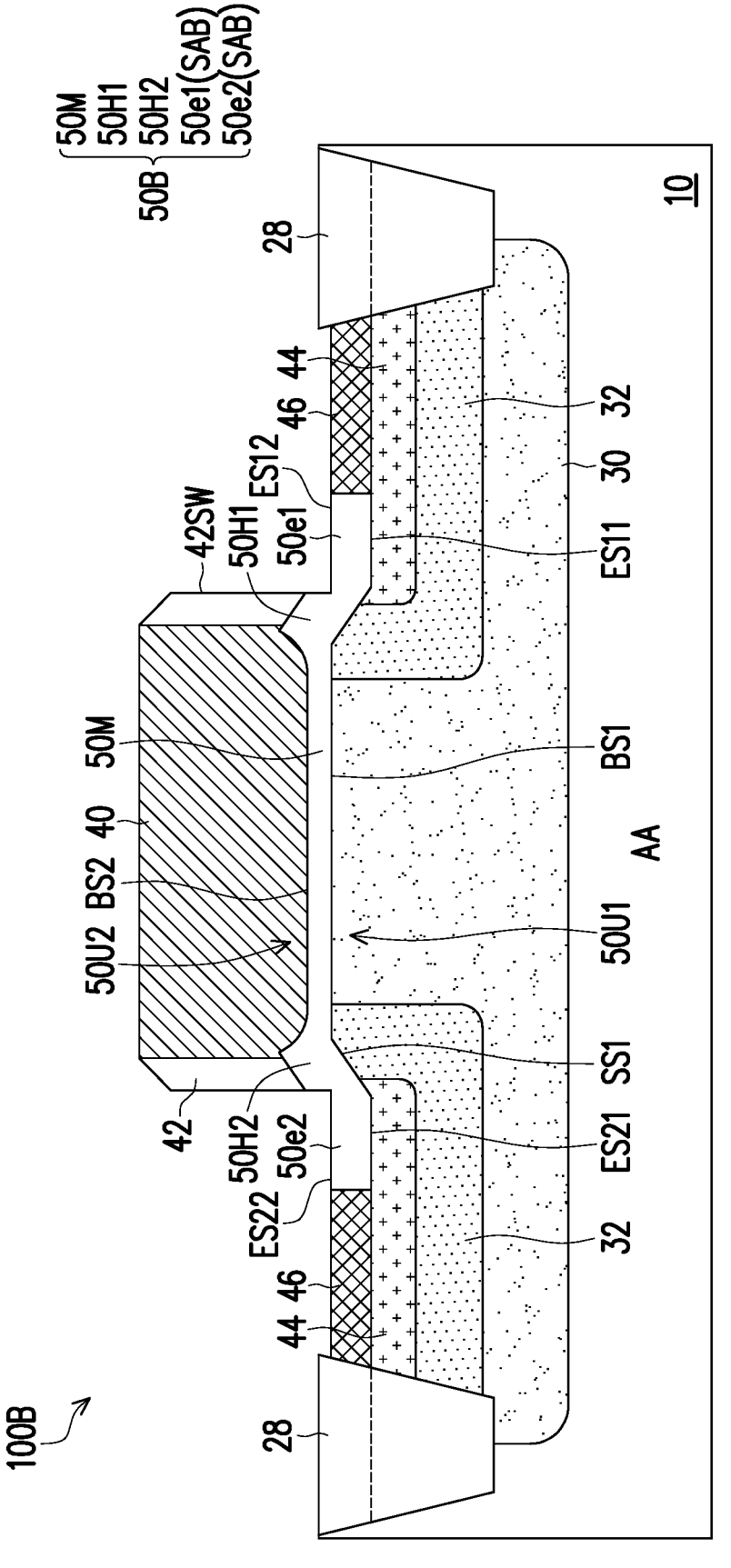

In the above embodiments, the sidewalls of the gate dielectric layer 50 are substantially flushed with the outer sidewalls 42SW of the spacers 42. However, the present disclosure is not limited thereto. In other embodiments, the gate dielectric layer 50 laterally extends beyond the outer sidewall 42SW of the spacers 42. FIG. 2A to FIG. 2C are schematic cross-sectional views of a method of fabricating a semiconductor device according to another embodiment of the present disclosure.

Referring to FIG. 2A, according to the method as shown in FIG. 1A to FIG. 1I, the similar process steps, from forming recesses 20 in the substrate 10 until forming spacers 42 on the sidewalls of the gate conductive layer 40, are performed. The spacers 42 expose the first gate dielectric material 34. The multiple doped region 44 are formed in doped regions 32 of the substrate 10. The doped regions 44 are covered by the first gate dielectric material 34.

Referring to FIG. 2B, a mask layer (not shown) is formed on the substrate 10. Then, lithography and patterning processes are performed to pattern the first gate dielectric material 34 to expose the doped regions 44. The remaining first gate dielectric material 34 and second gate dielectric material 38 form a gate dielectric layer 50B. The gate dielectric layer 50B is located between the gate conductive layer 40 and the substrate 10, between the spacers 42 and the substrate 10, and laterally extends beyond the outer sidewalls 42SW of the spacers 42. In this embodiment, the gate dielectric layer 50B may include a body part 50M, a first hump part 50H1 and a second hump part 50H2, and further include extension parts 50e1 and 50e2. The extension parts 50e1 and 50e2 laterally extend and protrude from the outer sidewalls 42SW of the spacers 42.

Referring to FIG. 2C, a metal silicide process is performed, so as to form metal silicide layers 46 on doped regions 44, respectively. The extension parts 50e1 and 50e2 can serve as salicide block (SAB) layers during the metal silicide process, so there is no need to form additional salicide block layers. The semiconductor device 100B is thus formed.

Figure 5:
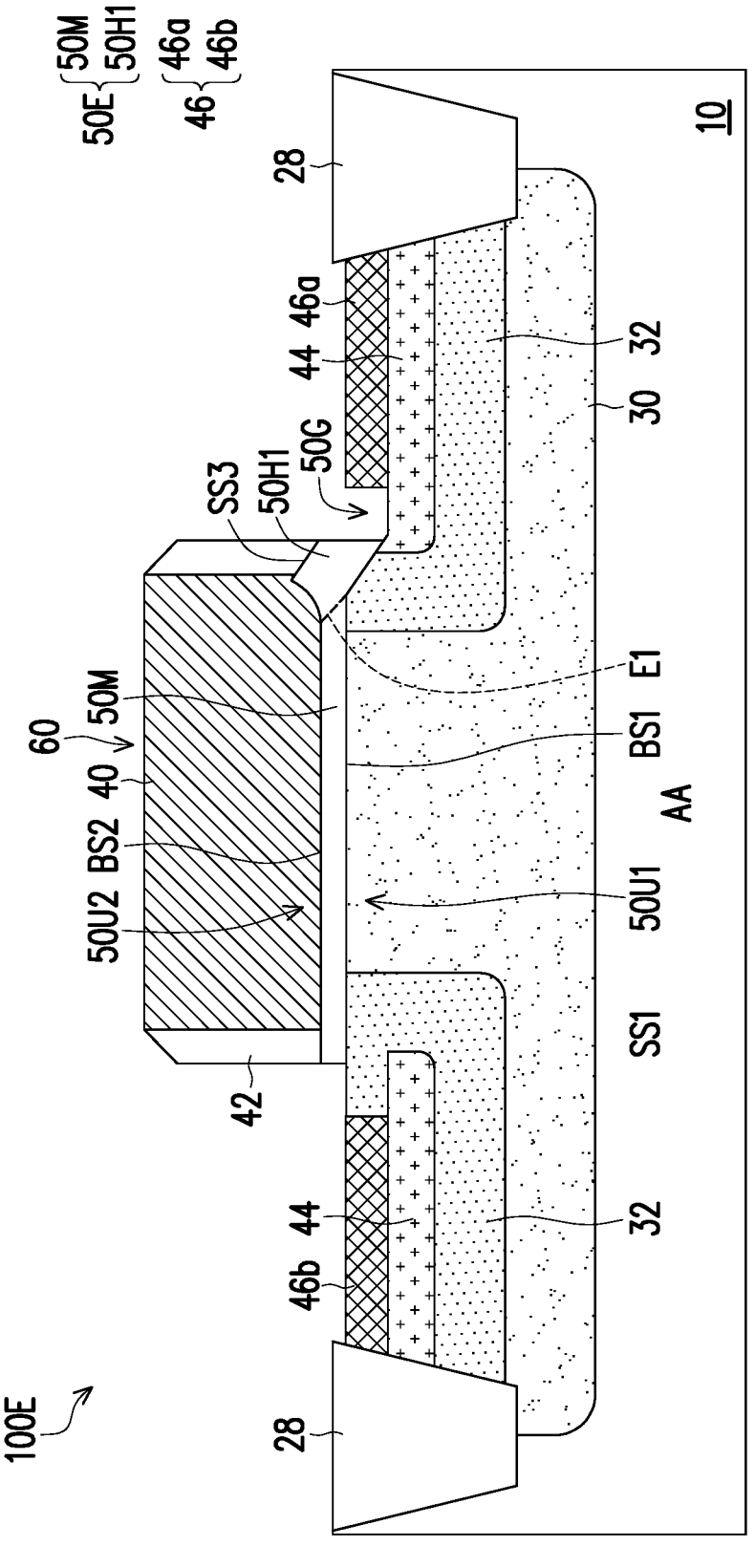

In the semiconductor device 100B, the gate dielectric layer 50B includes extension parts 50e1 and 50e2. The sidewalls of the extension parts 50e1 and 50e2 are respectively connected to the first hump part 50H1 and the second hump part 50H2, and the opposite sidewalls of the extension parts 50e1 and 50e2 are respectively in contact with the metal silicide layers 46. The bottom surface ES11 of the extension part 50e1 and the bottom surface ES21 of the extension part 50e2 are in contact with the doped regions 44. The top surface ES12 of extension part 50e1 and the top surface ES22 of extension part 50e2 may be lower than, equal to or higher than the top surface BS2 of the body part 50M. In addition, after the metal silicide layers 46 are formed, the extension parts 50e1 and 50e2 may be retained (as shown in FIG. 2C) or removed (as shown in FIG. 5).

The present disclosure may be applied to various semiconductor devices, not limited to the above semiconductor devices 100A and 100B.

Figure 3:
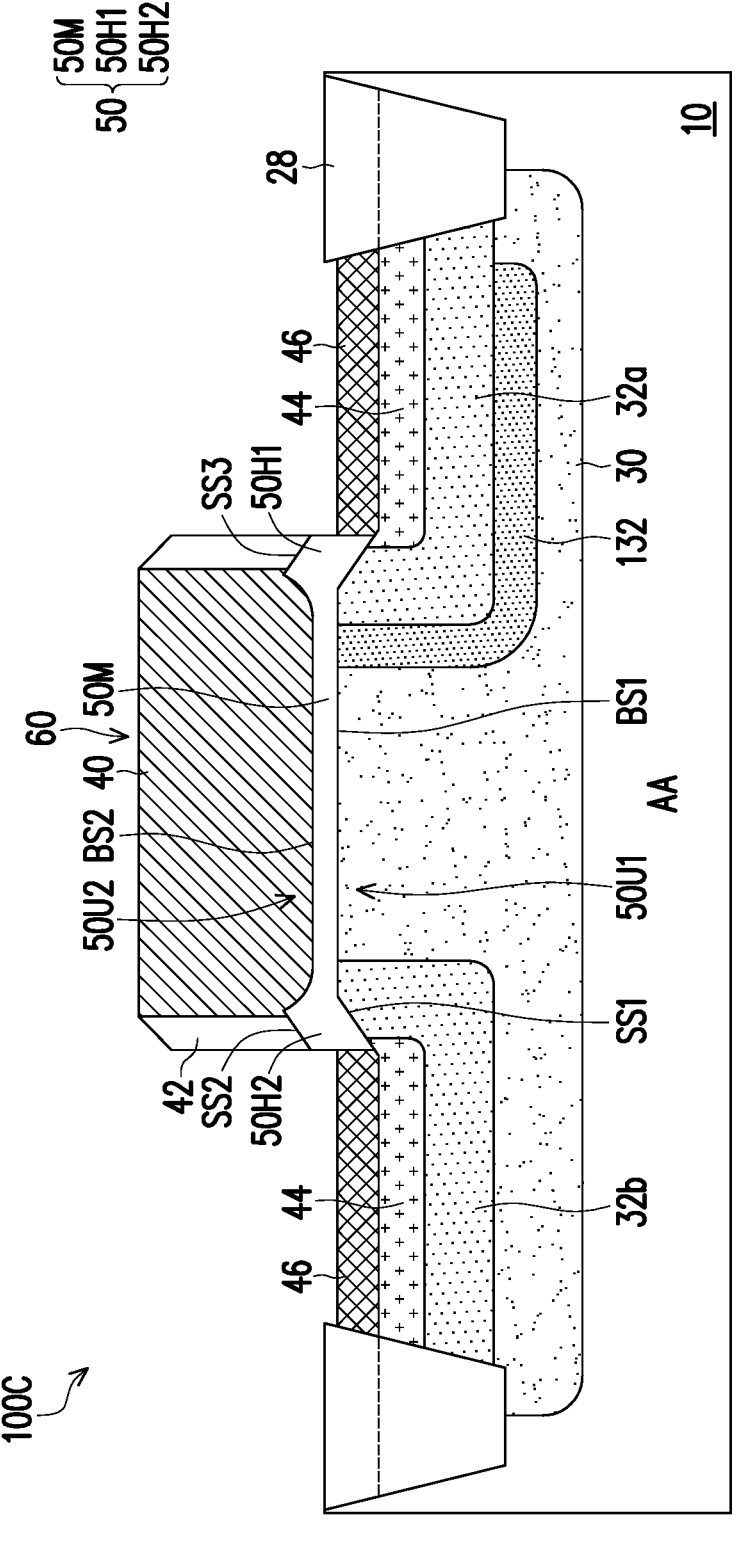
FIG. 3 to FIG. 5 are schematic cross-sectional views of various semiconductor devices according to various embodiments of the present disclosure.

For example, referring to FIG. 3, a semiconductor device 100C is similar to the semiconductor device 100A. The semiconductor device 100C further includes an additional doped region 132. The additional doped region 132 is disposed merely at one side of the gate structure 60. The additional doped region 132 covers the sidewall and a portion of the bottom surface of the doped region 32a. The doped region 32b is not covered by the additional doped region 132, but is in contact with the well region 30. The additional doped region 132 and the doped regions 32a and 30b have a dopant of the second conductivity type. The dopant of the second conductivity type may be an N-type dopant, such as phosphorus or arsenic. The doped concentration of the additional doped region 132 is lower than the doped concentration of the doped regions 32a and 30b.

Figure 4:
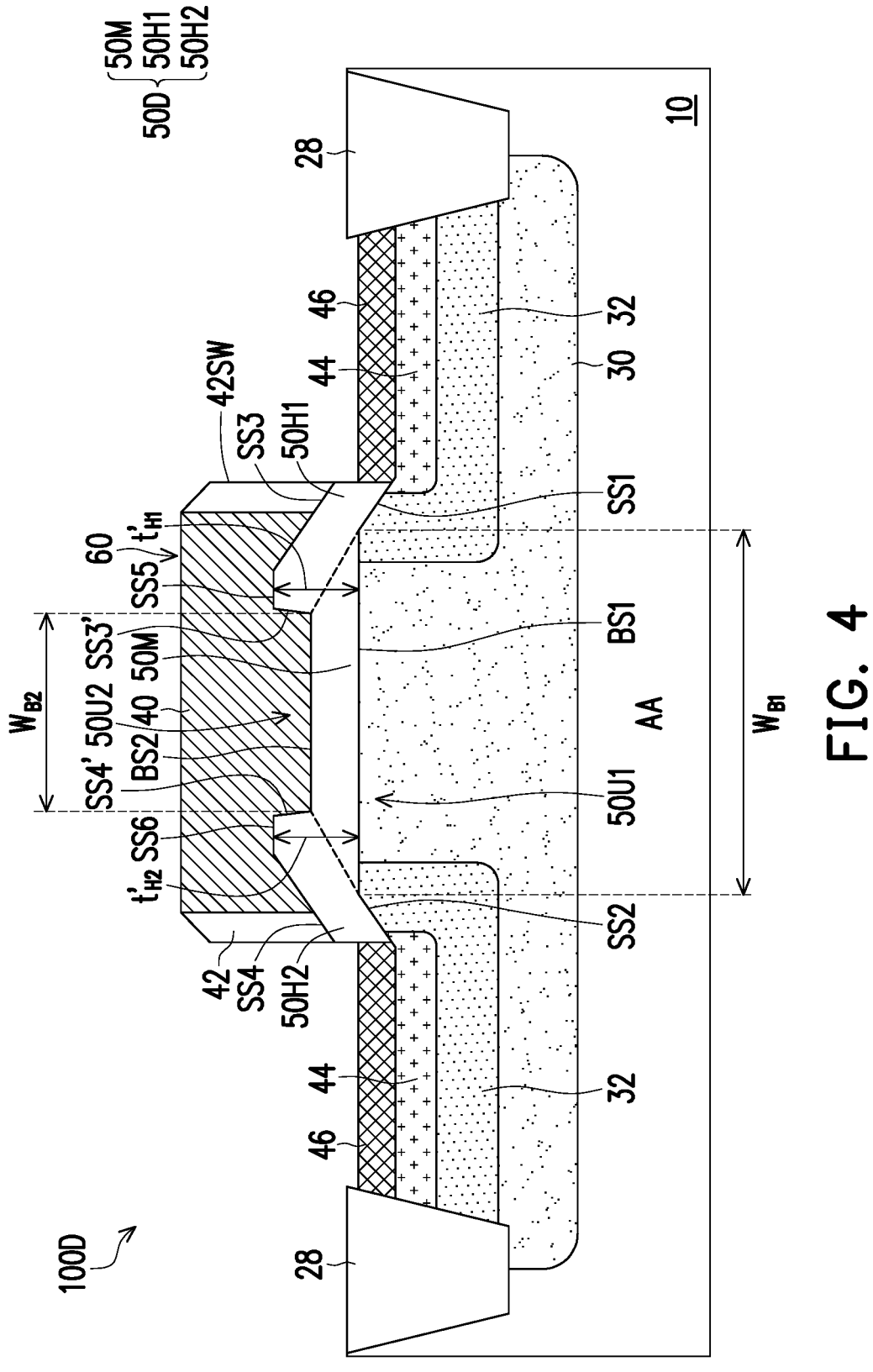

Referring to FIG. 4, a semiconductor device 100D is similar to the semiconductor device 100A. The gate dielectric layer 50D of the semiconductor device 100D is different from the gate dielectric layer 50 of the semiconductor device 100A. The shape of the body part 50M of the gate dielectric layer 50D may be still trapezoidal. The bottom surface BS1 and the top surface BS2 of the body part 50M have substantially flat surfaces. However, the width $W_{B2}$ of the top surface BS2 of the body part 50M is smaller, so the difference between the width $W_{B2}$ of the top surface BS2 and the width WB1 of the bottom surface BS1 is larger.

The first hump part 50H1 and the second hump part 50H2 of the gate dielectric layer 50D move closer to the center of the active region AA, making them closer to each other. The first hump part 50H1 further includes a top surface SS5 connected to the top surfaces SS3 and SS3'. The second hump part 50H2 further includes a top surface SS6 connected to the top surfaces SS4 and SS4'. The top surface SS5 and top surface SS6 may be approximately parallel to the bottom surface BS1. The gate dielectric layer 50D has a maximum thickness $t'_{H1}$ between the top surface SS5 and the bottom surface BS1. The gate dielectric layer 50D has a maximum thickness $t'_{H2}$ between the top surface SS6 and the bottom surface BS1. The maximum thicknesses $t'_{H1}$ and $t'_{H2}$ are located on the well region 30 between the doped regions 32.

Referring to FIG. 5 and FIG. 1J, a semiconductor device 100E is similar to the semiconductor device 100A. The gate dielectric layer 50E of the semiconductor device 100E is different from the gate dielectric layer 50 of the semiconductor device 100A. The gate dielectric layer 50E includes a body part 50M and a first hump part 50H1, but does not include a second hump part 50H2 (as shown in FIG. 1J). In other words, the gate dielectric layer 50E only includes a single hump part (e.g., first hump part 50H1) located at a single side E1 of the body part 50M.

The metal silicide layers 46 are not in contact with the gate dielectric layer 50E. The metal silicide layers 46a are spaced from the first hump part 50H1 of the gate dielectric layer 50E by a non-zero distance. In some embodiments, an extension part 50e1 (as shown in FIG. 2C) as a SAB layer during the metal silicide process for forming a metal silicide layer 46 is originally located in the position of a gap 50G between the metal silicide layer 46 and the first hump part 50H1, and such SAB layer is removed after the metal silicide layer 46 is formed.

In the above embodiments, multiple recesses are formed in the substrate before forming the gate dielectric layer. However, the present disclosure is not limited thereto. In other embodiments, the step of forming the recesses may be omitted. FIG. 6A to FIG. 6F are schematic cross-sectional views of a method of fabricating a semiconductor device according to other embodiments of the present disclosure.

Figure 6A:
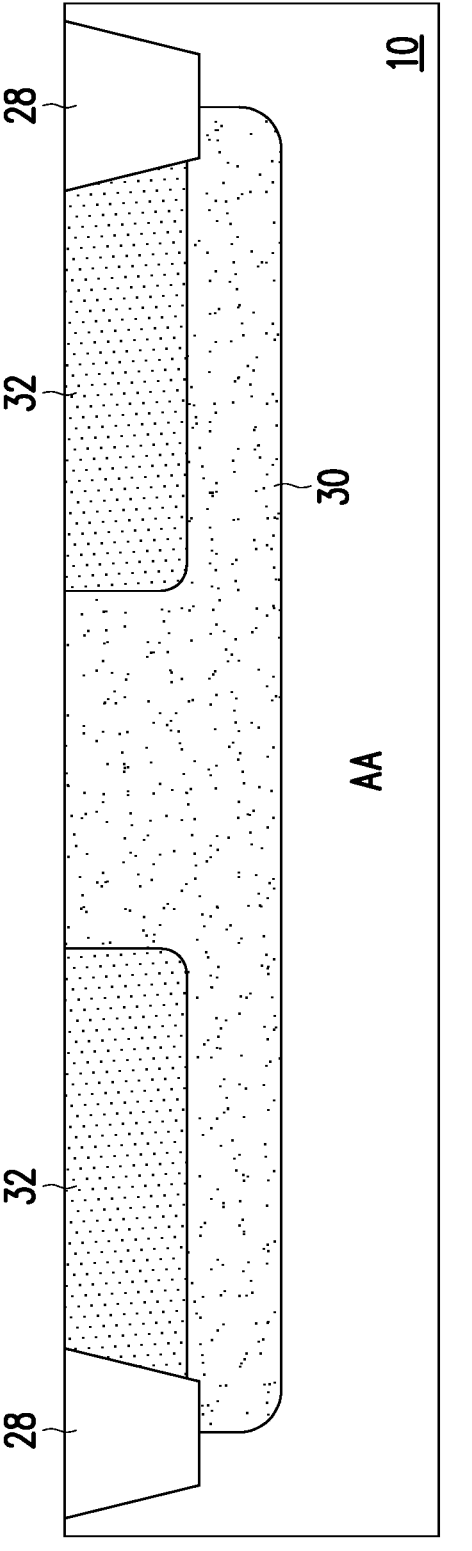
FIG. 6A to FIG. 6F are schematic cross-sectional views of a method of fabricating a semiconductor device according to other embodiments of the present disclosure.

Referring to FIG. 6A, multiple isolation structures 28 are formed in the substrate 10 with the above method, so as to define an active region AA. A well region 30 is formed in the substrate 10, and multiple doped regions 32 are formed in the well region 30. The conductivity type and forming method of the well region 30 and the multiple doped regions 32 may be the same as those of the well region 30 and the multiple doped regions 32 in the above embodiment.

Figure 6B:
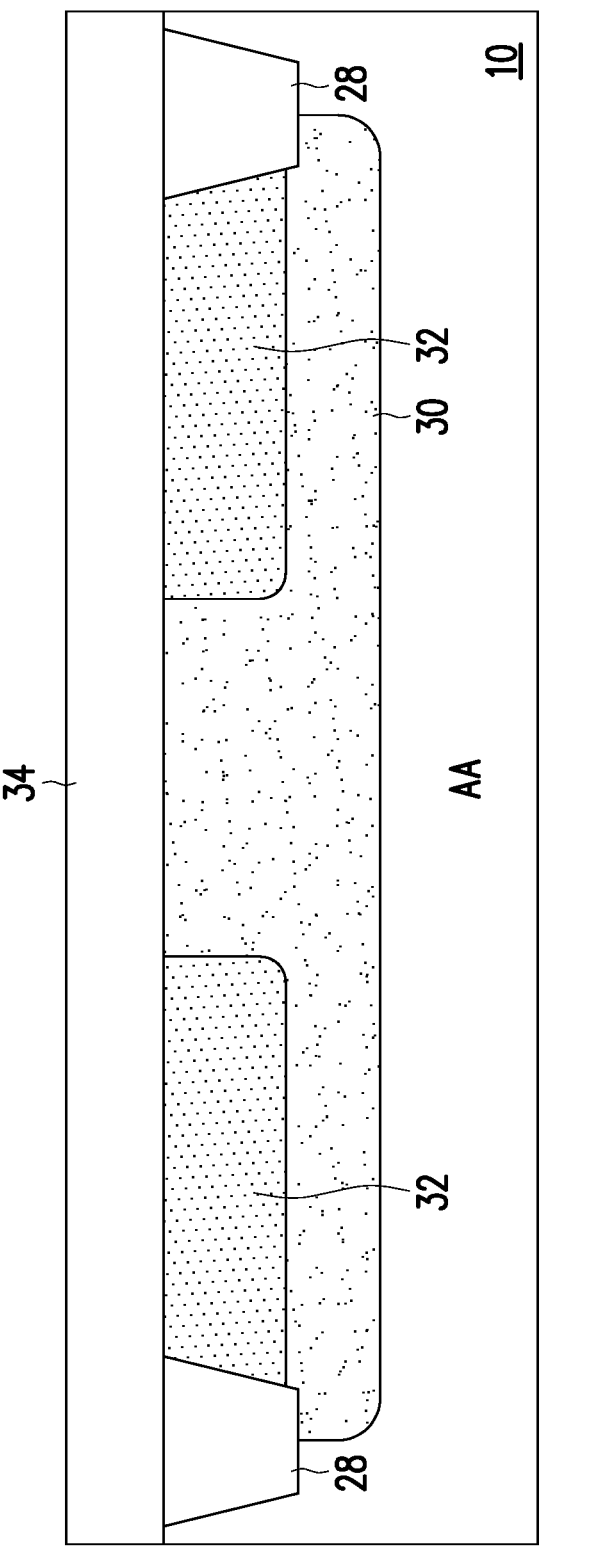

Referring to FIG. 6B, a first gate dielectric material 34 is formed on the substrate 10. The material and forming method of the first gate dielectric material 34 in this embodiment may be the same as those of the first gate dielectric material 34 in the above embodiment.

Figure 6C:
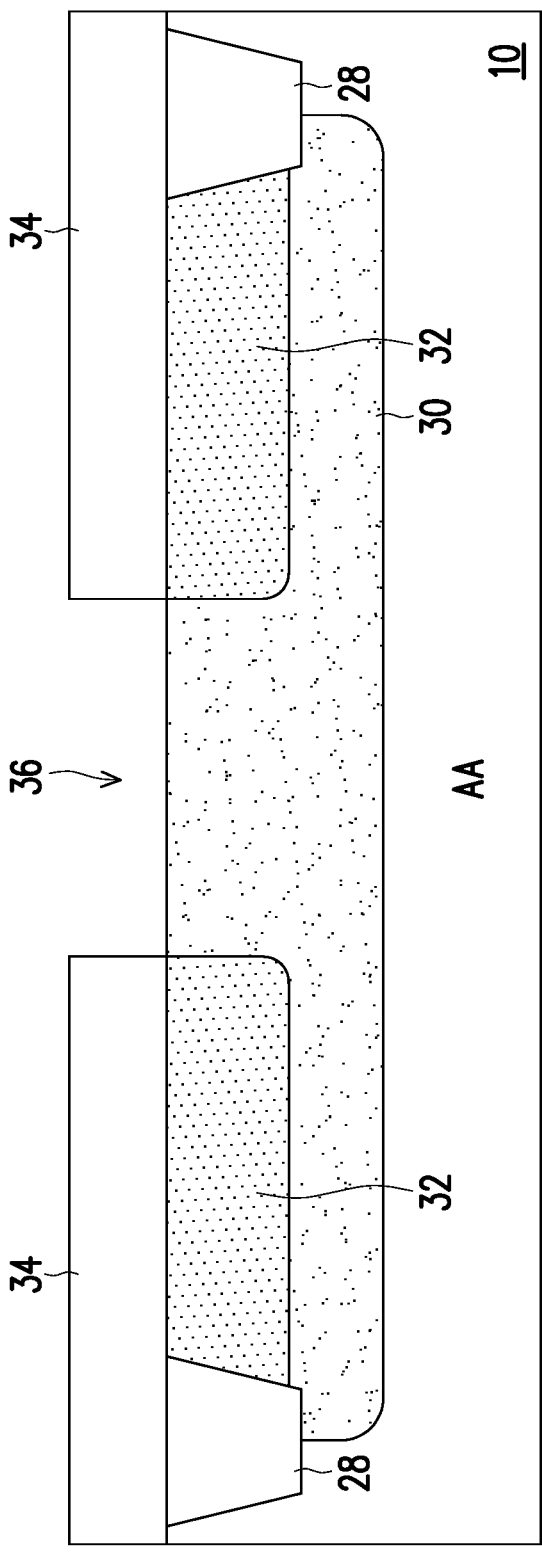

Referring to FIG. 6C, a mask layer (not shown) is formed on the first gate dielectric material 34, and then an etching process (e.g., an anisotropic etching process) is performed to at least partially remove the first gate dielectric material 34 on the well region 30, so as to form a trench 36. In some embodiments, the bottom of the trench 36 exposes the surface of the well region 30.

Figure 6D:
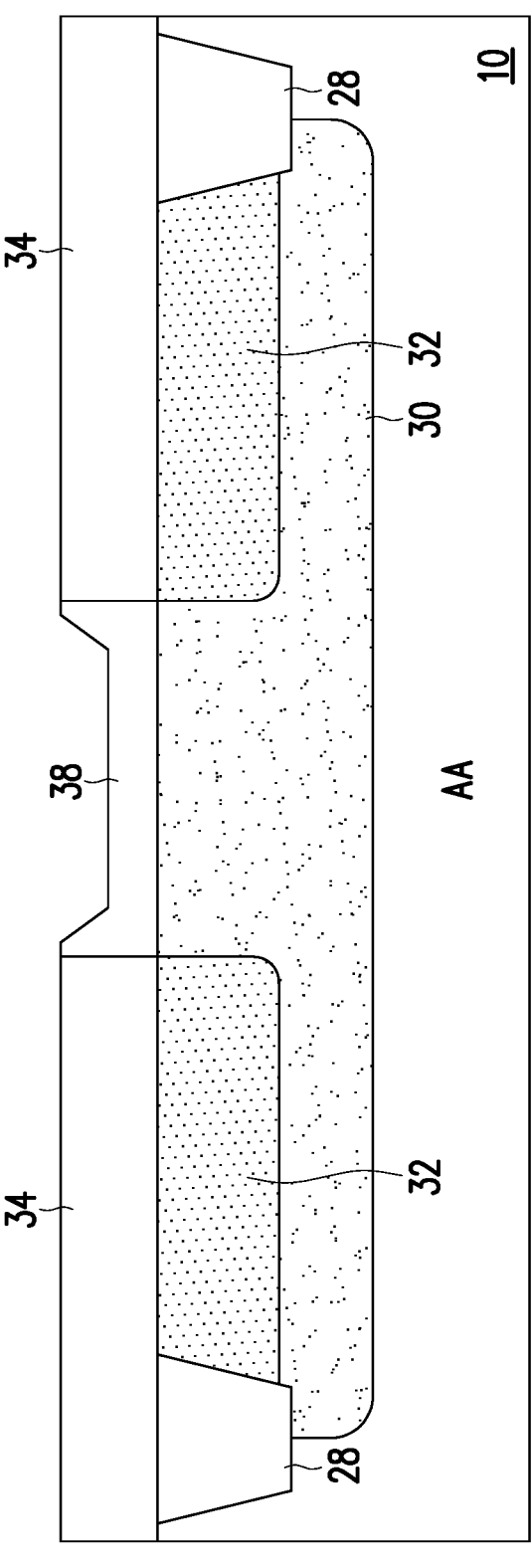

Referring to FIG. 6D, a second gate dielectric material 38 is formed in the trench 36. The material and forming method of the second gate dielectric material 38 in this embodiment may be the same as those of the second gate dielectric material 38 in the above embodiment.

Figure 6E:
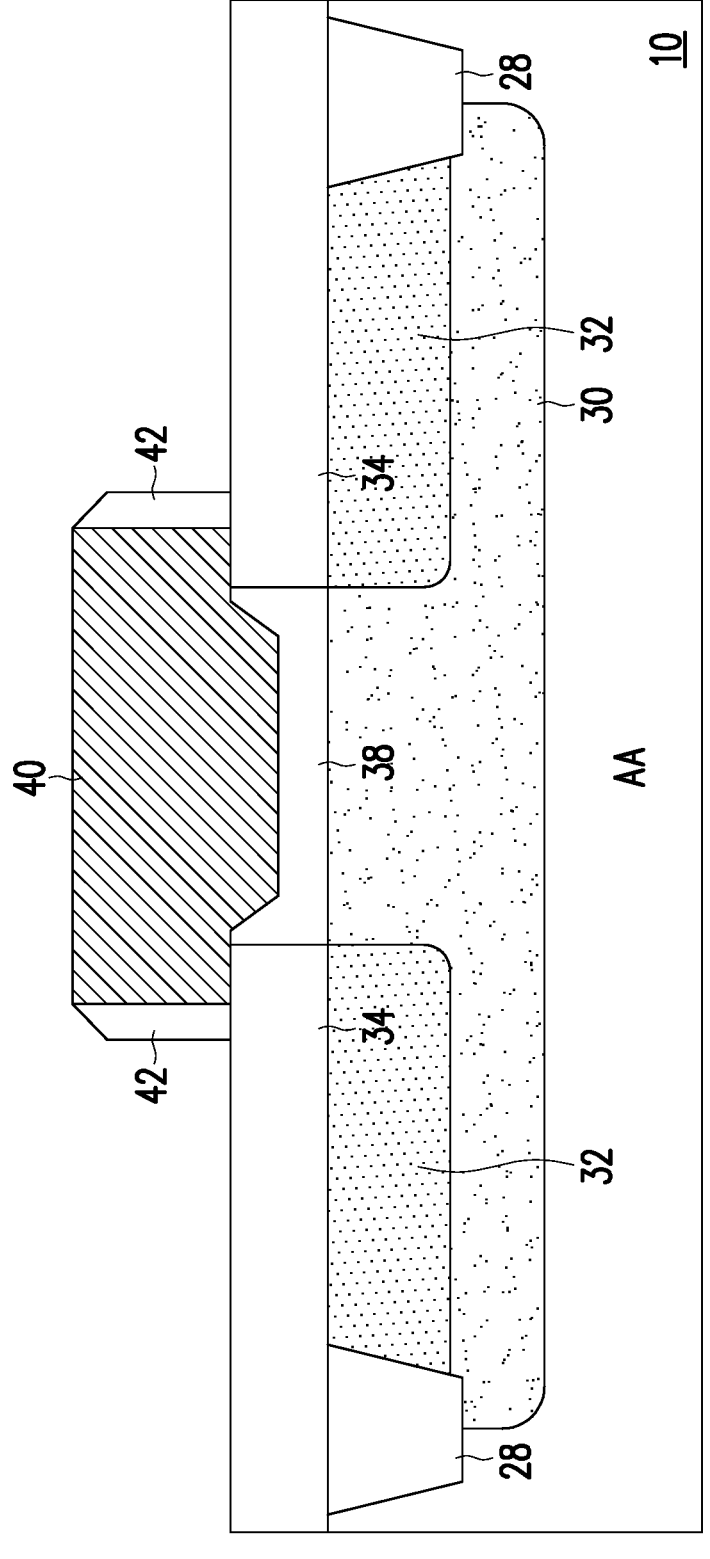

Referring to FIG. 6E, a gate conductive layer 40 is formed on the second gate dielectric material 38 and the first gate dielectric material 34, and multiple spacers 42 are formed on the sidewalls of the gate conductive layer 40. The material and forming method of the gate conductive layer 40 and the multiple spacers 42 in this embodiment may be the same as those of the gate conductive layer 40 and the multiple spacers 42 in the above embodiment.

Figure 6F:
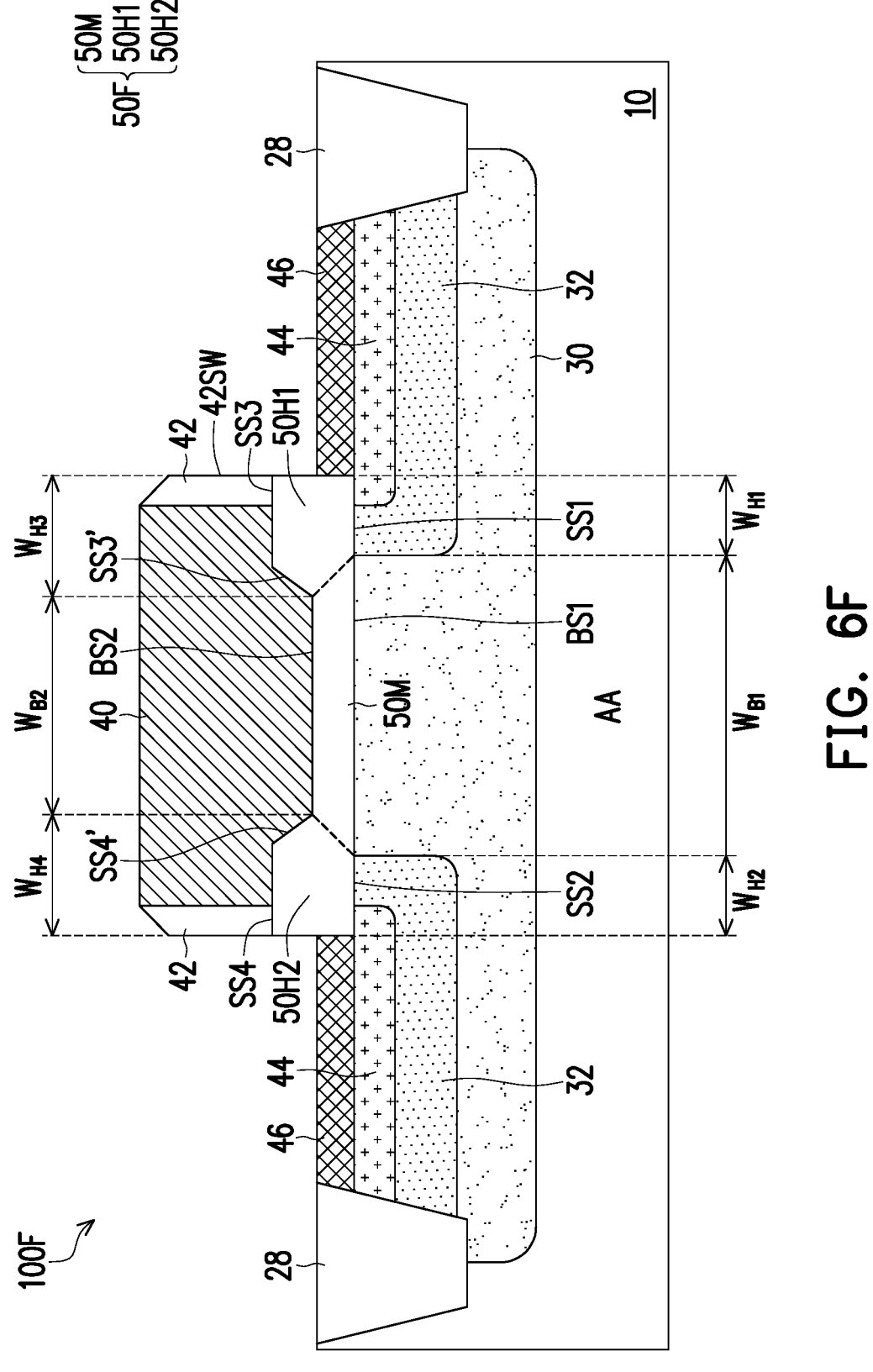

Referring to FIG. 6F, an etching process is performed by using the spacers 42 as a mask to remove a portion of the first gate dielectric material 34. The remaining first gate dielectric material 34 and the second gate dielectric material 38 form a gate dielectric layer 50F.

Multiple doped regions 44 are formed in the doped region 32 of the substrate 10. The multiple doped regions 44 and the multiple doped regions 32 have a dopant of the second conductivity type. Next, a metal silicide process is performed to form metal silicide layers 46 on the doped regions 44, respectively.

The gate dielectric layer 50F of this embodiment is similar to the gate dielectric layer 50 described above. The gate dielectric layer 50F of this embodiment has a flat bottom surface. The gate dielectric layer 50F includes a body part 50M, a first hump part 50H1 and a second hump part 50H2. The first hump part 50H1 and the second hump part 50H2 are located at two sides of the body part 50M and connected to the body part 50M.

The cross section of the body part 50M is substantially trapezoidal. The width $W_{B1}$ of the bottom surface BS1 is greater than the width $W_{B2}$ of the top surface BS2 of the body part 50M. The width $W_{B2}$ of the top surface BS2 of the body part 50M is greater than or equal to the width $W_{H3}$ of the top surface of the first hump part 50H1, and greater than or equal to the width $W_{H4}$ of the top surface of the second hump part 50H2. Similarly, the width $W_{B1}$ of the bottom surface BS1 of the body part 50M may be greater than or equal to the width $W_{H1}$ of the bottom surface SS1 of the first hump part 50H1, and greater than or equal to the width $W_{H2}$ of the bottom surface SS2 of the second hump part 50H2.

The bottom surface BS1 of the body part 50M, the bottom surface SS1 of the first hump part 50H1, and the bottom surface SS2 of the second hump part 50H2 have substantially flat surfaces. In this embodiment, the bottom surface BS1 of the body part 50M, the bottom surface SS1 of the first hump part 50H1 and the bottom surface SS2 of the second hump part 50H2 are coplanar, so that the gate dielectric layer 50F has a flat bottom surface.

The top surface BS2 of the body part 50M, the top surface SS3' of the first hump part 50H1 and the top surface SS4' of the second hump part 50H2 form a U-shaped surface. The top surface SS3 of the first hump part 50H1 and the top surface SS4 of the second hump part 50H2 have substantially flat surfaces and are higher than the top surface BS2 of the body part 50M. The top surface BS2 of the body part 50M, and the top surfaces SS3' and SS3 of the first hump part 50H1 form a stepped shape. The top surface BS2 of the body part 50M, and the top surfaces SS4' and SS4 of the second hump part 50H2 form a stepped shape. The sidewalls of the first hump part 50H1 and the second hump part 50H2 are substantially flushed with the outer sidewalls 42SW of the spacers 42 and in contact with the metal silicide layers 46.

In embodiments of the present disclosure, the thickness in the central region of the gate dielectric layer is smaller, so as reduce the threshold voltage. The thickness in the edge region of the gate dielectric layer is greater, so as to reduce the gate-induced drain leakage current and allow higher voltages applied to the source/drain regions.

What is claimed is:

1. A method of fabricating a semiconductor device, comprising:
   providing a substrate;
   forming a plurality of recesses in the substrate;
   forming a first gate dielectric material on the substrate and in the plurality of recesses;
   at least partially removing the first gate dielectric material on the substrate between the plurality of recesses to form a trench;
   forming a second gate dielectric material in the trench;
   forming a gate conductive layer on the second gate dielectric material, and forming a plurality of spacers on sidewalls of the gate conductive layer;
   removing a portion of the first gate dielectric material, so that the remaining first gate dielectric material and the second gate dielectric material form a gate dielectric layer, wherein the gate dielectric layer comprises:
      a body part; and
      a first hump part, located at a first edge of the body part, wherein a thickness of the first hump part is greater than a thickness of the body part; and
   forming a plurality of doped regions in the substrate at two sides of the plurality of spacers.

2. The method of claim 1, wherein a width of the body part is greater than or equal to a width of the first hump part.

3. The method of claim 1, wherein the gate dielectric layer further comprises:
   a second hump part, located at a second edge of the body part, wherein a thickness of the second hump part is greater than the thickness of the body part.

4. The method of claim 3, wherein a width of the body part is greater than or equal to a width of the second hump part.

5. The method of claim 4, wherein the first hump part and the second hump part of the gate dielectric layer extend to protrude from outer sidewalls of the plurality of spacers.

6. The method of claim 5, further comprising:
   performing a metal silicide process by using the first hump part and the second hump part of the gate dielectric layer as an insulating block layer, so as to form a plurality of metal silicide layers on the plurality of doped regions.

7. The method of claim 1, wherein the first gate dielectric material on the substrate between the plurality of recesses is completely removed, so that a bottom surface of the trench exposes the substrate.

8. The method of claim 1, wherein the first gate dielectric material on the substrate between the plurality of recesses is partially removed, so that a bottom surface of the trench exposes a portion of the first gate dielectric material.

9. A method of fabricating a semiconductor device, comprising:
   providing a substrate;
   forming a first gate dielectric material on the substrate;
   patterning the first gate dielectric material to form a trench;
   forming a second gate dielectric material in the trench;
   forming a gate conductive layer on the second gate dielectric material and the first gate dielectric material, and forming a plurality of spacers on sidewalls of the gate conductive layer;

removing portions of the second gate dielectric material and the first gate dielectric material to form a gate dielectric layer, wherein the gate dielectric layer comprises:

a body part; and a first hump part, located at a first edge of the body part, wherein a thickness of the first hump is greater than a thickness of the body part; and forming a plurality of doped regions in the substrate at two sides of the plurality of spacers.

10. The method of claim 9, wherein the gate dielectric layer further comprises:

a second hump part, located at a second edge of the body part, wherein a thickness of the second hump is greater than the thickness of the body part.

11. The method of claim 10, wherein a width of the body part is greater than or equal to a width of the first hump part, and greater than or equal to a width of the second hump part.

12. The method of claim 11, further comprising:

performing a metal silicide process to form a plurality of metal silicide layers on the plurality of doped regions.

13. The method of claim 9, wherein the first gate dielectric material is patterned to form the trench, so that a bottom surface of the trench exposes the substrate.

14. The method of claim 9, wherein the first gate dielectric material is patterned to form the trench, so that a bottom surface of the trench exposes a portion of the first gate dielectric material.

\* \* \* \* \*